United States Patent [19]

Hwang

[11] Patent Number: 5,621,606

[45] Date of Patent: Apr. 15, 1997

[54] CAPACITOR UTILIZING HIGH DIELECTRIC CONSTANT MATERIAL

[75] Inventor: Cheol-seong Hwang, Seongnam, Rep. of Korea

[73] Assignee: Samsung Electronics Co., Ltd., Suwon, Rep. of Korea

[21] Appl. No.: 579,126

[22] Filed: Dec. 27, 1995

[30] Foreign Application Priority Data

Dec. 29, 1994 [KR] Rep. of Korea .................. 94-39000

[51] Int. Cl.$^6$ .................. H01G 4/06; H01G 4/232
[52] U.S. Cl. .................. 361/321.4; 361/301.4; 361/311; 257/301; 257/296; 257/295; 257/306; 257/304; 257/621; 438/396
[58] Field of Search .................. 361/321.1, 321.4, 361/321.5, 301.4, 328, 311, 306.3; 257/295, 296, 301, 303, 310, 311, 534, 599, 600, 621; 437/52, 60, 919; 365/145

[56] References Cited

U.S. PATENT DOCUMENTS 5,389,566  2/1995  Lage .................................. 437/52
5,472,900  12/1995 Vu et al. ............................ 437/60

*Primary Examiner*—Leo P. Picard
*Assistant Examiner*—Anthony Dinkins
*Attorney, Agent, or Firm*—Allen LeRoy Limberg

[57] ABSTRACT

A side-by-side capacitor structure in which the side-by-side capacitors are formed using a common dielectric layer, with a capacitor plate electrode shaped as an electrostatic shield for preventing stray capacitance between the side-by-side capacitors. More particularly, a substrate of semiconductive material has first and second contact areas on its top surface. First and second electrodes are located parallel to the top surface of the substrate of semiconductive material, but spaced therefrom by an electrically insulating layer that has first and second contact holes extending therethrough from the first and second contact areas to the first and second electrodes respectively. These contact holes are each filled with a respective conductive plug. The electrically insulating layer has a trench in its surface with first and second sides respectively aligned with an edge of the first electrode and with an edge of the second electrode. A dielectric film extends over the first electrode, the inside of the trench, and the second electrode. A third electrode extends over the dielectric film to form a first capacitor with the first electrode, the first and third electrodes providing the plates of that first capacitor, and to form a second capacitor with the second electrode, the second and third electrodes providing the plates of that second capacitor. A portion of the third electrode extends into the trench as a shield against stray capacitance between the first and second electrodes.

23 Claims, 5 Drawing Sheets

CAPACITOR UTILIZING HIGH DIELECTRIC CONSTANT MATERIAL

The present invention relates to a capacitor structure for inclusion within a semiconductor device and a fabricating method therefor and, more particularly, to a capacitor in which the generation of stray capacitance between adjoining storage electrodes can be prevented and a fabricating method therefor.

BACKGROUND OF THE INVENTION

With the recent increase in the integration density of a DRAM (dynamic random access memory) device, many methods have been proposed to increase capacitance within a limited cell area. These methods generally entail thinning the dielectric film, increasing the effective area of the capacitor plates, using a material having a higher dielectric constant, or combining two or more of the foregoing procedures. Thinning of the dielectric film below 100 Å leads to inferior reliability in a large-capacitance memory device owing to Fowler-Nordheim current. Simply increasing the area of the capacitor plates within a limited cell area requires stacking up the capacitors in multiple levels, which increases the cost per unit and reduces production yield. So a material of a high dielectric constant such as $SrTiO_3$ (hereunder, STO) or $(Ba, Sr)TiO_3$ (hereunder, BSTO) as the dielectric film is customarily used to increase the capacitance.

However, in case where capacitors utilizing the high-dielectric-constant material are arranged side-by-side in close proximity, stray capacitance occurs between adjoining storage electrodes. The stray capacitance is a particular problem where a layer of high-dielectric-constant material extends continuously from between the plates or electrodes in one of the side-by-side capacitors to between plates or electrodes in the other of the side-by-side capacitors. Patterning of the layer of high-dielectric-constant material so it is discontinuous between the side-by-side capacitors is a possible solution to this problem, but presents some processing problems, certain ones of which reduce the effective area of the capacitor plates somewhat. The stray capacitance between side-by-side capacitors, particularly serious when the dielectric layer is formed with the high-dielectric-constant material, can cause faulty operation of the device they are incorporated in. When it is desired to change the charge stored on just one of the capacitors, the charge stored on the other of the capacitors will undesirably exhibit some change also, because of coupling between the side-by-side capacitors through the stray capacitance.

FIGS. 1A–1C are sections illustrating step by step a conventional method for fabricating a capacitor in a semiconductor device.

Referring to FIG. 1A, after an electrical insulation layer 12 is formed on a semiconductor substrate 10, a contact hole for exposing a contact area in the surface of the substrate 10 is formed. A conductive plug 14 is formed by filling the contact hole with conductive material. Then, a conductive layer 16 is formed by depositing the conductive material on the resultant and a mask layer 18 is formed by patterning after depositing oxide.

Referring to FIG. 1B, storage electrodes 17 are formed by selectively etching the conductive layer 16 using the mask layer 18 of FIG. 1A as an etching mask.

Referring to FIG. 1C, a dielectric film 20 and a capacitor plate electrode 22 are successively formed by depositing an insulator such as BSTO and conductive material on the structure resulting from forming the storage electrodes 17. Reference mark S indicates portions of the dielectric film 20 across which stray capacitance occurs between adjacent ones of the storage electrodes 17. The capacitor plate electrode 22 covers the sides of the storage electrode as well as its top. In large DRAMs (256 Mb and larger) the capacitance between the plate electrode and the side surfaces of a storage electrode is a significant portion of the total capacitance between the plate electrode and the storage electrode. For example in a 1 Gb DRAM in which the height of the storage electrodes is about 1000 Å, the capacitance between the plate electrode and the side surfaces of a storage electrode has typically been about half the capacitance between the plate electrode and the top surface of the storage electrode. That is, the capacitance between the plate electrode and the side surfaces of a storage electrode is about 35% of the total capacitance between the plate electrode and the storage electrode.

The stray capacitance between adjacent ones of the storage electrodes 17 is eliminated in the invention by changing the shape of the capacitor plate electrode 22 so that it provides an electrostatic shield between each pair of adjacent ones of the storage electrodes 17. This is facilitated by forming a respective trench in the electrical insulation layer 12 surrounding each of the storage electrodes 17. The dielectric film 20 dips down into this trench, leaving a portion of this trench to be filled by the capacitor plate electrode 22. The capacitor plate electrode 22 wraps further around each storage electrode 17. The dielectric film 20 is typically about 500 Å thick. So, in modified capacitor structures embodying the invention the capacitance between the plate electrode and the side surfaces of a storage electrode can be more than the capacitance between the plate electrode and the top surface of the storage electrode. That is, the capacitance between the plate electrode and the side surfaces of a storage electrode is typically about 65% of the total capacitance between the plate electrode and the storage electrode. This increased capacitance, owing to greater effective plate area in modified capacitor structures embodying the invention, is a significant additional advantage of these modified capacitor structures.

SUMMARY OF THE INVENTION

The invention is embodied in a first of its aspects in a side-by-side capacitor structure in which the side-by-side capacitors are formed using a common dielectric layer, with a capacitor plate electrode shaped as an electrostatic shield for preventing stray capacitance between the side-by-side capacitors. More particularly, a substrate of semiconductive material having respective first and second opposed surfaces has first and second contact areas on its second surface. First and second electrodes having respective first and second opposed surfaces each have the first surface thereof located parallel to the second surface of the substrate of semiconductive material, but spaced therefrom. An electrically insulating layer has first and second opposed surfaces with first and second contact holes extending therebetween, has its first surface adjoining the second surface of the substrate of semiconductive material so the first contact hole spans at least a portion of the first contact area and so the second contact hole spans at least a portion of the second contact area, has its second surface adjoining the first surface of the first electrode so the first contact hole is covered therewith, has its second surface adjoining the first surface of the second electrode so the second contact hole is covered therewith, and has a trench in its second surface. This trench has first and second sides respectively aligned with an edge of the first electrode and with an edge of the second electrode. A first conductive plug extends through the first contact hole and makes ohmic contact to the first contact area and to the first electrode; and a second conductive plug extends through the second contact hole and makes ohmic contact to the second contact area and to the second electrode. A dielectric film extends over the first electrode, the inside of the trench, and the second electrode. A third electrode extends over the dielectric film to form a first capacitor with the first electrode, the first and third electrodes providing the plates of that first capacitor, and to form a second capacitor with the second electrode, the second and third electrodes providing the plates of that second capacitor. A portion of the third electrode extends into the trench as a shield against stray capacitance between the first and second electrodes.

Further aspects of the invention concern the methods for forming such side-by-side capacitor structures.

DETAILED DESCRIPTION OF THE INVENTION

Figure 1A:
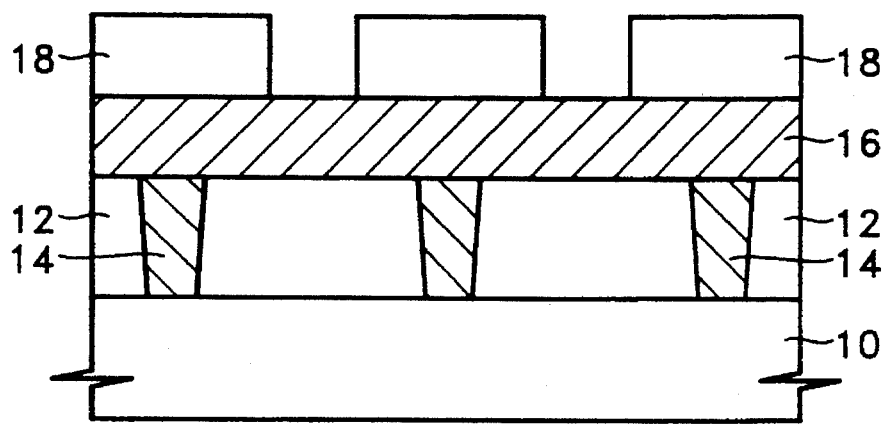
FIGS. 1A–1C are sections illustrating step by step a conventional method for fabricating a side-by-side capacitor structure.
Figure 1B:
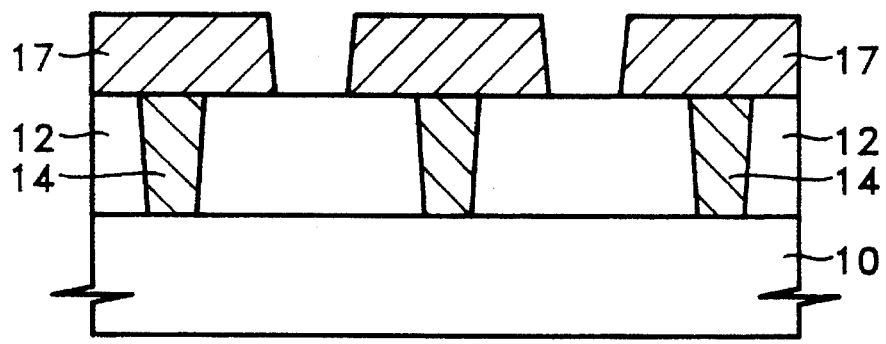
Figure 1C:
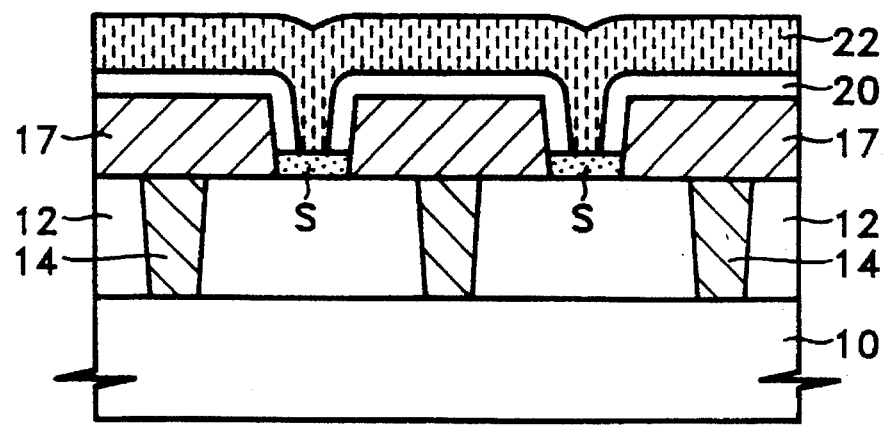
Figure 2A:
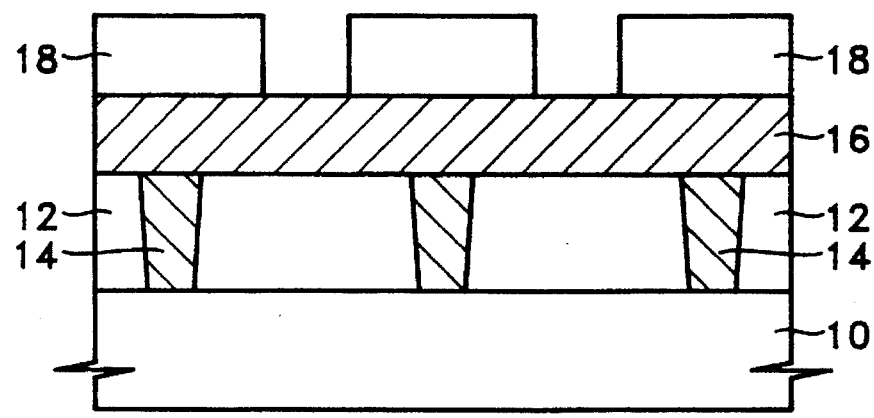
FIGS. 2A–2C are sections illustrating step by step a method for fabricating a side-by-side capacitor structure, which method and structure embody aspects of the present invention.
Figure 2B:
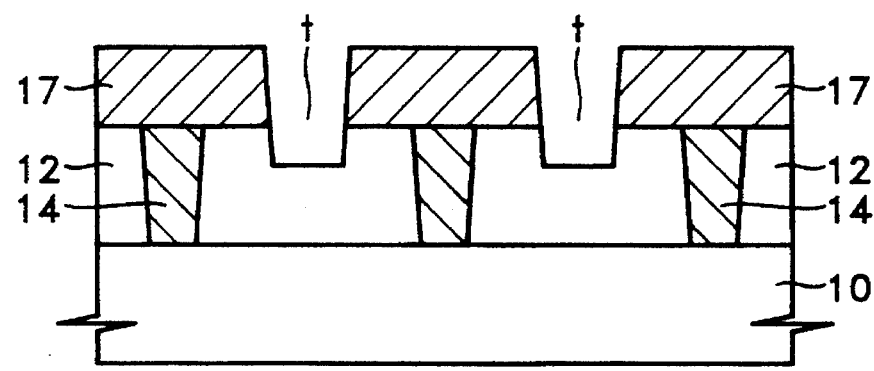
Figure 2C:
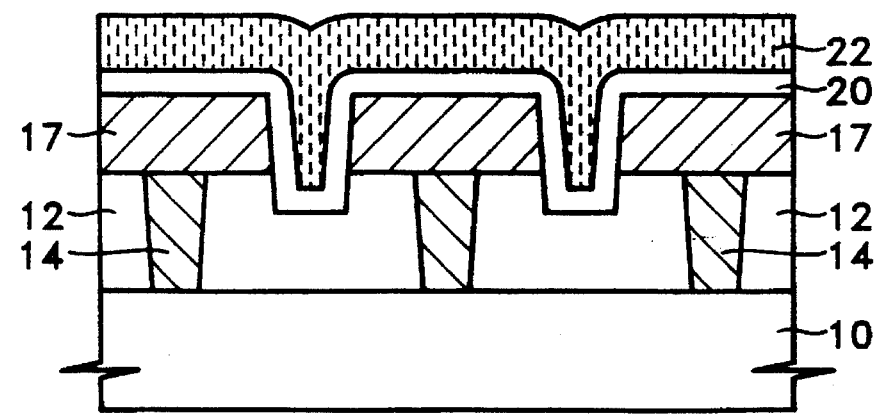

FIGS. 2A–2C are sections illustrating step by step a method for fabricating a side-by-side capacitor structure. The structural components in these sections that perform functions similar to those of corresponding structural components in FIGS. 1A–1C are correspondingly numbered in FIGS. 2A–2C.

FIG. 2A illustrates the result of the following steps. An electrical insulation layer 12 is formed by coating electrical insulation material, e.g., BPSG on a semiconductor substrate 10 in order to smooth an uneven surface of the substrate 10 caused by devices formed on the substrate. Next, contact holes are formed through the electrical insulation layer 12 by etching selectively as determined by a photolithographic process. Then, the inside of the contact holes are filled with conductive plugs 14 by depositing a conductive material (e.g., a polycrystalline silicon doped with impurities) on the structure resulting from the foregoing selective etching and then etching back the deposited conductive material to provide an even surface on the electrical insulation layer 12.

Subsequently, a conductive layer 16 is formed on the electrical insulation layer 12 by depositing the conductive material (e.g., the polycrystalline silicon doped with impurities). Then, a mask layer 18 is formed by depositing electrical insulation material, (e.g., an oxide) on the conductive layer 16 and patterning the deposited electrical insulation material.

FIG. 2B illustrates the result of forming storage electrodes 17. Storage electrode 17 is formed by etching the conductive layer 16 of FIG. 2A selectively using the mask layer 18 as an etching mask. Here, trenches t are formed in the exposed surface of the electrical insulation layer 12 between the storage electrodes 17 by over-etching the conductive layer.

Here, it is preferable that the over-etching is performed to a depth depending on the thickness of the dielectric film to be formed subsequently. That is, the above over-etching is executed such that the depth of the trenches is greater than the thickness of the dielectric film. For instance, when the dielectric film is formed to be 200–500 Å thick, the over-etching is performed such that each trench t is formed to a depth about 100 Å greater, to be in a range of 300–600 Å below the exposed surface of the electrical insulation layer 12.

FIG. 2C shows structure embodying an aspect of the invention, which structure results after forming a dielectric film 20 on the FIG. 2B structure and subsequently forming a plate electrode 22 of the capacitor. The dielectric film 20 of the capacitor is formed by depositing an electrically insulating silicon oxide on the structure resulting after the trench is formed. Next, the plate electrode 22 of the capacitor is formed by depositing conductive material on the dielectric film 20. This conductive material can be doped polycrystalline silicon or a metal.

This conductive material extends into the trenches t that are deeper than the thickness of the dielectric film 20 formed on a surface of the electrical insulation layer 12 by the over-etching between the adjoining storage electrodes 17, providing an electrostatic shield so that the stray capacitance between the adjoining storage electrodes 17 does not occur. There is also some increase in capacitance by reason of the extended effective area of the plate electrode 22 as it wraps over each of the storage electrodes 17.

Figure 3:
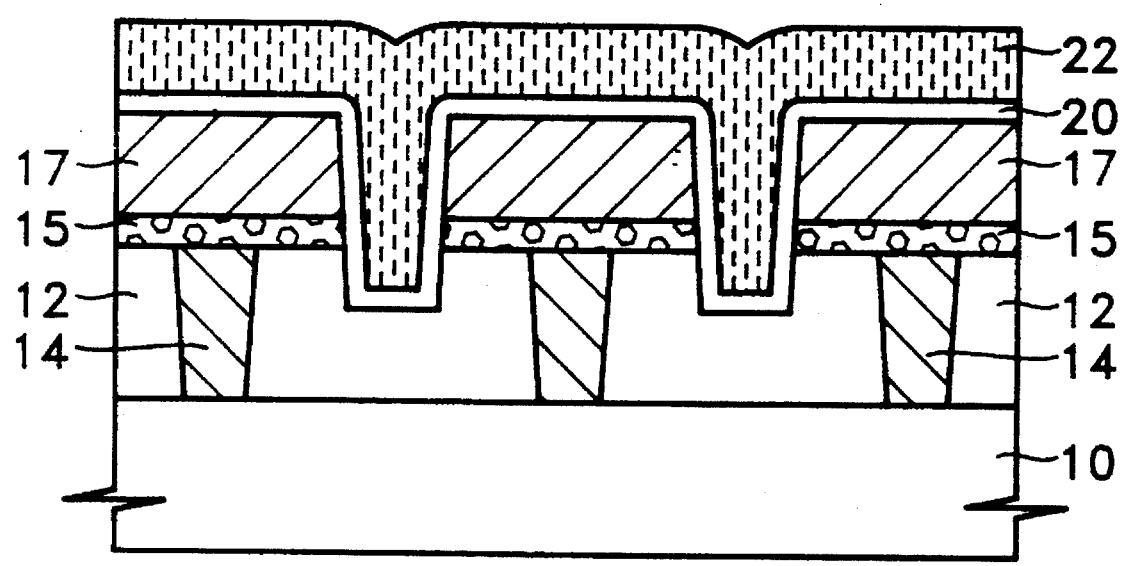
FIG. 3 shows a side-by-side capacitor structure embodying the present invention in another aspect thereof.

FIG. 3 shows a capacitor structure embodying the present invention in another of its aspects, wherein the dielectric film 20 utilizing a high-dielectric-constant material such as BSTO. In such case, it is preferred to form storage and plate electrodes from a metal (e.g., platinum). That is because when polycrystalline silicon is employed for the plate and storage electrodes, a $SiO_2$ layer is formed at the interface of each electrode with a dielectric film of high-dielectric-constant material, so that the total dielectric constant is sharply reduced. The structural components in these sections that perform functions similar to those of corresponding structural components in FIGS. 1A–1C and in FIGS. 2A–2C are correspondingly numbered even though the materials from which these structures are formed may differ.

In case of employing metal such as platinum (Pt) as a material for the storage electrode, it is preferable to form a barrier layer 15 between the storage electrode and underlying silicon in order to prevent diffusion of the silicon into the metal and thus keep interface resistance low.

The barrier layer 15 is formed by depositing, for example, Ti/TiN on the structure resulting after the conductive plug 14 is formed and back-etching to even the surface of the electrical insulation layer 12. The steps before forming conductive plug 14 and after forming the barrier layer 15 proceed conform with those of the embodiment described with reference to FIGS. 2A–2C, except for the storage electrodes 17 and plate electrode 22 being formed from metal, and except for the dielectric film 20 being formed from a high-dielectric-constant material such as BSTO ($BaSrTiO_3$), STO($SrTiO_3$), PZT($PbZrTiO_3$), $BaTiO_3$, $PbTiO_3$ or $Bi_4Ti_3O_2$. Since electrodes 17 and plate electrode 22 are metal they may be formed by sputtering rather than chemical vapor deposition procedures, if desired.

In the FIG. 3 structure, not only the occurrence of the stray capacitance between the storage electrodes is prevented and the effective area of the capacitor increased somewhat, but also capacitance can be increased by forming a dielectric film with a high-dielectric-constant material.

FIGS. 4A–4E are sections illustrating a method for fabricating the capacitor embodying the present invention in yet another aspect. The structural components in these sections that perform functions similar to those of corresponding structural components in FIGS. 1A–1C, in FIGS. 2A–2C and in FIG. 3 are correspondingly numbered even though the materials from which these structures are formed may differ.

Figure 4A:
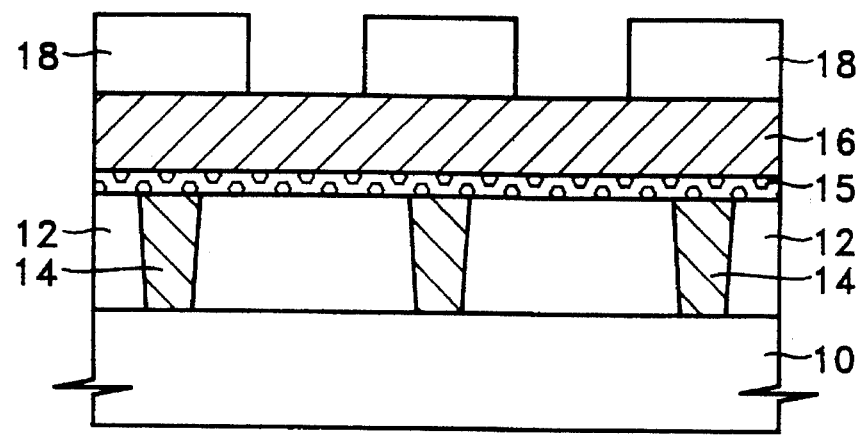
FIGS. 4A–4E are sections illustrating step by step a method for fabricating a side-by-side capacitor structure, which method and structure embody still further aspects of the present invention.

FIG. 4A shows the result of the following procedures. An electrical insulation layer 12 is formed by coating electrical insulation material (e.g., BPSG or member of the SOG series) on a semiconductor substrate 10 in order to smooth an uneven surface of the substrate 10 caused by devices formed on the substrate. Next, contact holes are formed through the electrical insulation layer 12 by etching selectively as determined by a photolithographic process. Then, the inside of the contact holes are filled with conductive plugs 14 by depositing a conductive material (e.g., a polycrystalline silicon doped with impurities) on the structure resulting from the foregoing selective etching and then etching back the deposited conductive material to provide an even surface on the electrical insulation layer 12. The resulting structure then has a barrier layer 15 of refractory metal, such as Ti/TiN, formed thereon. A conductive layer 16 is formed by depositing a conductive material (e.g., platinum) on the barrier layer 15. The barrier layer 15 serves to prevent the formation of platinum silicide between the conductive layer 16 and the conductive plug 14 and to increase adhesive strength between the conductive layer 16 and the electrical insulation layer 12. The barrier layer 15 is formed to the thickness of 200–400Å, preferably about 300Å, and the conductive layer 16 is formed 2000–4000Å, preferably about 300Å. A mask layer 18 is formed on the conductive layer 16 by patterning after depositing oxide. When platinum (Pt) is used as the storage electrode, it is preferable that the mask layer 18 is formed into a double layer of a photoresist layer and the electrical insulation layer which is, for instance, an oxide film.

Figure 4B:
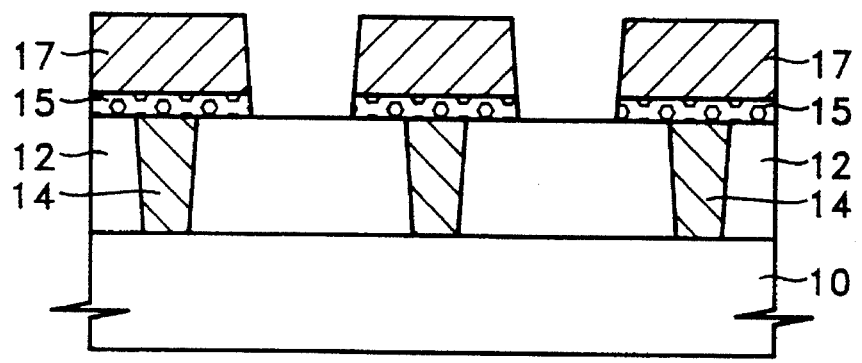

FIG. 4B shows the result of forming the storage electrodes 17. The storage electrodes 17 are formed by etching the conductive layer 16 of FIG. 4A and the underlying barrier layer 15 using the mask layer 18 as an etching mask. More particularly, the conductive layer formed of Pt and barrier layer are etched at 200° C. by using gas such as a gas mixture of $SF_6$ and $Cl_2$, or at the normal temperature by using a gas mixture of $Cl_2$, $O_2$ and Ar.

Figure 4C:
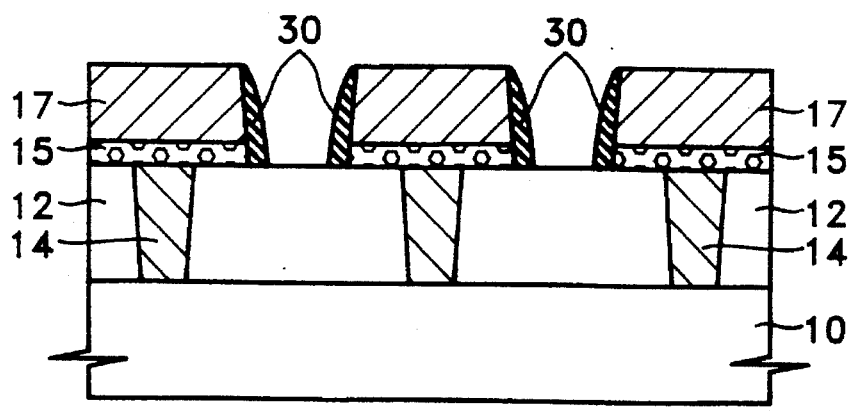

FIG. 4C shows the result forming a respective spacer 30 around each of the storage electrodes 17. A conductive material (e.g., Pt) is deposited on the FIG. 4B structure, and then, a spacer 30 is formed as a separating wall around the side walls of each storage electrode 17 and its underlying barrier layer 15 by anisotropically etching the Pt-deposited product. The relatively fast etch in the vertical direction removes the Pt at the surface of the electrical insulation layer 12 between the storage electrodes 17 and the Pt just deposited on the tops of the storage electrodes 17, while leaving the Pt just deposited on the side walls of the storage electrodes 17. The conductive material for spacers 30 is formed to the thickness of about 500Å and is preferably formed from the same substance as the storage electrodes 17 are formed of. The spacers 30 are preferably formed of a conductive material so the effective capacitance of the capacitor plates is not reduced by thickening of the dielectric. The purpose of the spacers 30 is to prevent the barrier layer 15 being contacted by a dielectric film to be formed subsequently. That is, the spacers 30 forestall oxidation of the barrier layer 15 being caused by contact with the dielectric film 20.

Figure 4D:
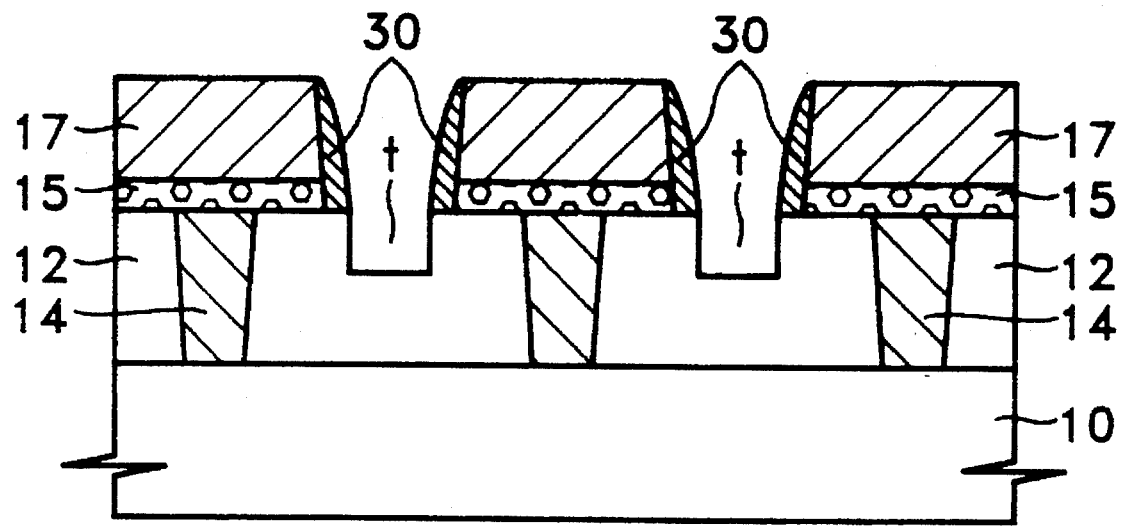

FIG. 4D shows the result of forming trenches t on the electrical insulation layer 12. The trenches t are formed on the electrical insulation layer 12 by its being over-etched by the anisotropic etching used to form the spacers 30. Here again, it is preferred that the amount of over-etching is such that the trenches t are somewhat deeper than the thickness of the dielectric film 20 to be formed subsequently.

Figure 4E:
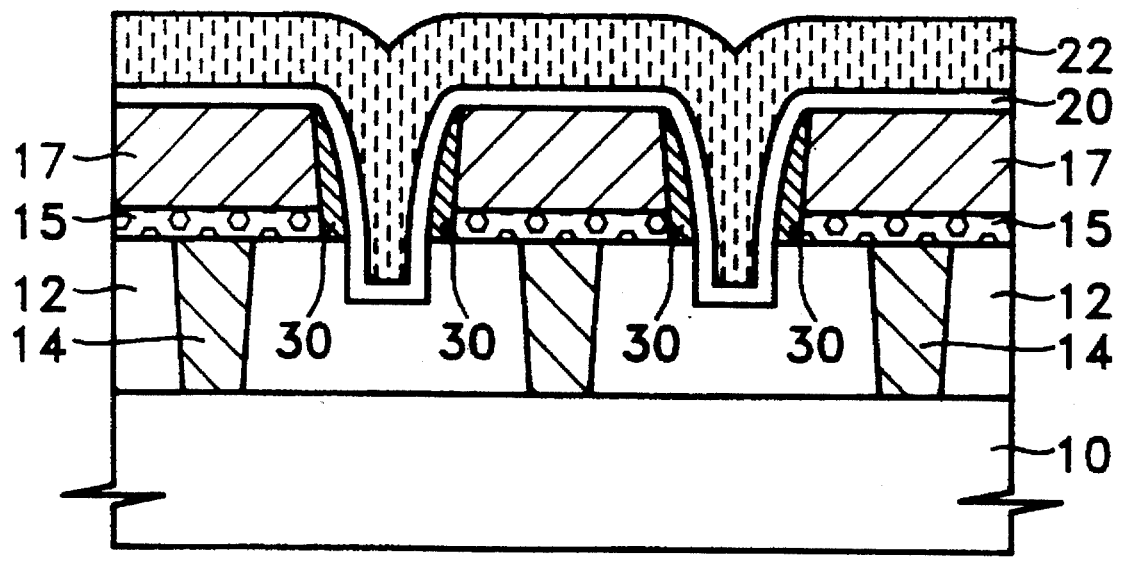

FIG. 4E shows the result of forming the dielectric film 20 and subsequently forming a plate electrode 22 of the capacitor. The dielectric film 20 of the capacitor is formed by depositing the high-dielectric-constant material (e.g., BSTO) on the resultant where the trench is formed. Then, the plate electrode 22 of the capacitor is formed by depositing the conductive material (e.g., Pt) on the dielectric film 20.

The FIG. 4E structure can alternatively be constructed using PZT ($PbZrTiO_3$), BSTO ($BaSrTiO_3$), $SrTiO_3$, $BaTiO_3$, $PbTiO_3$ and $Bi_4Ti_3O_2$ dielectric film 20.

Where in circuitry other than DRAMs side-by-side capacitors are used that do not have a common plate electrode in the final structure because of having different electrical connections, the plate electrodes can be formed as a common plate electrode in accordance with the illustrated structures, with instrusions into somewhat wider trenches. Thereafter the plate electrodes can be separated by etching channels through the centers of the intrusions, with each plate electrode providing an electrostatic shield for its respective storage electrode. The channels are then filled with an insulative material of relatively low dielectric constant.

It is noted that the present invention is not limited to the preferred embodiment described above, and the present invention includes that variations and modifications by one skilled in the art can be effected within the spirit and scope of the present invention defined in the appended claims.

What is claimed is:

1. In combination:

a substrate of semiconductive material having respective first and second opposed surfaces;

a first contact area on the second surface of said substrate of semiconductive material;

a first electrode having respective first and second opposed surfaces, the first surface of said first electrode being located parallel to the second surface of said substrate of semiconductive material but spaced therefrom;

an electrically insulating layer having first and second opposed surfaces with a first contact hole extending therebetween, having its said first surface adjoining the second surface of said substrate of semiconductive material so said first contact hole spans at least a portion of said contact area, having its said second surface adjoining the first surface of said first electrode so said first contact hole is covered by said first electrode, and having a trench in its said second surface, which trench has first and second sides, said first side of said trench being aligned with an edge of said first electrode;

a first conductive plug extending through said first contact hole for making ohmic contact to said first contact area and to said first electrode;

a second electrode adjoining the second surface of said electrically insulating layer, said second electrode having an edge adjacent to the second side of said trench;

a dielectric film extending over said first electrode and the inside of the trench; and a third electrode extending over said dielectric film to form a first capacitor with said first electrode, said first and third electrodes providing the plates of said first capacitor, a portion of said third electrode extending into said trench as a shield against stray capacitance between said first electrode and said second electrode.

2. The combination of claim 1; wherein a second contact hole extends between the first and second surfaces of said electrically insulating layer, said second contact hole being located such that it is covered by said second electrode; and wherein said dielectric film also extends over said second electrode with said third electrode extending over the portion of said dielectric film that extends over said second electrode to form a second capacitor with said second electrode, said second and third electrodes providing the plates of said second capacitor; said combination further comprising:

a second contact area on the second surface of said substrate of semiconductive material, located such that it spans said second contact hole; and a second conductive plug extending through said second contact hole for making ohmic contact to said second contact area and to said second electrode.

3. The combination of claim 2, wherein the depth of said trench on said second surface of said electrically insulating layer is greater than the thickness of said dielectric film.

4. The combination of claim 2, wherein said dielectric film has a thickness within the range of 200–500Å inclusive.

5. The combination of claim 2, wherein said dielectric film is of a material selected from a group consisting of PZT ($PbZrTiO_3$), BSTO ($BaSrTiO_3$), STO ($SrTiO_3$), $BaTiO_3$, $PbTiO_3$ and $Bi_4Ti_3O_{12}$.

6. The combination of claim 2, wherein said first and second conductive plugs are doped polycrystalline silicon, and wherein said first and second electrodes are doped polycrystalline silicon.

7. The combination of claim 6, wherein said third electrode is metal.

8. The combination of claim 2, wherein said first and second conductive plugs are doped polycrystalline silicon; wherein said first and second electrodes are metal; wherein a first barrier layer is interposed between said first conductive plug and said first electrode, to prevent migration of silicon into the first electrode and to prevent migration of metal into the first conductive plug; and wherein a second barrier layer is interposed between said second conductive plug and said second electrode, to prevent migration of silicon into the second electrode and to prevent migration of metal into the second conductive plug.

9. The combination of claim 8, wherein said third electrode is metal.

10. The combination of claim 1, wherein the depth of said trench on said second surface of said electrically insulating layer is greater than the thickness of said dielectric film.

11. The combination of claim 1, wherein said dielectric film has a thickness within the range of 200–500Å inclusive.

12. The combination of claim 1, wherein said first conductive plug is doped polycrystalline silicon; wherein said first and second electrodes are metal; and wherein a barrier layer is interposed between said first conductive plug and said first electrode, to prevent migration of silicon into the first electrode and to prevent migration of metal into the first conductive plug.

13. The combination of claim 12, wherein said third electrode is metal.

14. In combination:

a substrate of semiconductive material having respective first and second opposed surfaces;

a first contact area on the second surface of said substrate of semiconductive material;

a first electrode having respective first and second opposed surfaces extending to a peripheral wall of said first electrode, the first surface of said first electrode being located parallel to the second surface of said substrate of semiconductive material but spaced therefrom;

a first barrier layer on the first surface of said first electrode;

a first spacer surrounding the peripheral wall of said first electrode, said first spacer composed of a first separating wall of a spacer material, said first separating wall having an inside against the peripheral wall of said first electrode and having an outside;

an electrically insulating layer having first and second opposed surfaces with a first contact hole extending therebetween, having its said first surface adjoining the second surface of said substrate of semiconductive material so said first contact hole spans at least a portion of said contact area, having its said second surface adjoining the first surface of said first electrode so said first contact hole is covered by said first electrode, and having a trench in its said second surface, which trench has first and second sides, said first side of said trench being aligned with at least a portion of the outside of said first separating wall;

a first conductive plug extending through said first contact hole for making ohmic contact to said first contact area and to said first electrode;

a second electrode adjoining the second surface of said electrically insulating layer, said second electrode having a peripheral wall adjacent to the second side of said trench;

a dielectric film extending over said first electrode as surrounded by said first spacer and further extending over the inside of the trench; and a third electrode extending over said dielectric film to form a first capacitor with said first electrode, said first and third electrodes providing the plates of said first capacitor, a portion of said third electrode extending into said trench as a shield against stray capacitance between said first electrode and said second electrode.

15. The combination of claim 14; wherein said second electrode has respective first and second opposed surfaces extending to a peripheral wall of said second electrode, with the first surface of said second electrode adjoining the second surface of said electrically insulative layer; and wherein a second contact hole extends between the first and second surfaces of said electrically insulating layer, said second contact hole being located such that it is covered by said second electrode; said combination further comprising:

a second barrier layer on said second electrode;

a second contact area on the second surface of said substrate of semiconductive material, located such that it spans said second contact hole;

a second conductive plug extending through said second contact hole for making ohmic contact to said second contact area and to the first surface of said second electrode; and a second spacer surrounding the peripheral wall of said second electrode, said second spacer composed of a second separating wall of said spacer material, said second separating wall having an inside against the peripheral wall of said second electrode and having an outside, said dielectric film further extending over the second surface of said second electrode, said third electrode further extending over the portion of said dielectric film that extends over the second surface of said second electrode to form a second capacitor with said second electrode, said second and third electrodes providing the plates of said second capacitor.

16. The combination of claim 15, wherein said dielectric film is of a material selected from a group consisting of PZT (PbZrTiO$_3$), BSTO (BaSrTiO$_3$), SrTiO$_3$, BaTiO$_3$, PbTiO$_3$ and Bi$_4$Ti$_3$O$_{12}$.

17. The combination of claim 16, wherein said first and second electrodes are metal, and wherein said first and second barrier layers are formed from a refractory metal.

18. The combination of claim 17, wherein said first and second electrodes are platinum.

19. A capacitor as claimed in claim 18, wherein said spacer material is selected from a group consisting of platinum and Si$_3$N$_4$.

20. The combination of claim 14, wherein said dielectric film is of a material selected from a group consisting of PZT (PbZrTiO$_3$), BSTO (BaSrTiO$_3$), SrTiO$_3$, BaTiO$_3$, PbTiO$_3$ and Bi$_4$Ti$_3$O$_{12}$.

21. The combination of claim 20, wherein said first electrode is metal, and wherein said first barrier layer is formed from a refractory metal.

22. The combination of claim 21, wherein said first electrode is platinum.

23. A capacitor as claimed in claim 22, wherein said spacer material is selected from a group consisting of platinum and Si$_3$N$_4$.

* * * * *